United States Patent [19]

Nakao

[11] Patent Number: 5,465,112
[45] Date of Patent: Nov. 7, 1995

[54] TESTING APPARATUS FOR DETECTING AN IMAGE SIGNAL IN RADIO WAVES LEAKING FROM AN INFORMATION PROCESSING SYSTEM

[75] Inventor: Tomoyuki Nakao, Kawasaki, Japan

[73] Assignee: Fujitsu Limited, Kanagawa, Japan

[21] Appl. No.: 160,211

[22] Filed: Dec. 2, 1993

[30] Foreign Application Priority Data

Dec. 2, 1992 [JP] Japan .................................. 4-322844

[51] Int. Cl.⁶ ........................................... H04N 7/00
[52] U.S. Cl. .................... 348/4; 348/1; 348/180
[58] Field of Search .................................. 348/192, 193, 348/180, 729, 184, 189, 1, 4; 345/904; 358/10, 139; 380/5; 455/2; H04N 17/00, 17/02, 7/00

[56] References Cited

U.S. PATENT DOCUMENTS

| | | | |
|---|---|---|---|
| 2,896,070 | 7/1959 | Fremont et al. | 348/1 |
| 2,903,508 | 9/1959 | Hathaway | 348/1 |
| 4,577,220 | 3/1986 | Laxton et al. | 348/1 |
| 4,581,639 | 4/1986 | Judge | 348/192 |
| 4,583,233 | 4/1986 | Barrows | 348/192 |
| 4,635,109 | 1/1987 | Comeau | 348/4 |
| 4,670,789 | 6/1987 | Plume | 348/180 |
| 4,764,808 | 8/1988 | Solar | 348/4 |
| 4,807,031 | 2/1989 | Broughton et al. | 348/460 |
| 4,847,685 | 7/1989 | Gall et al. | 348/4 |

FOREIGN PATENT DOCUMENTS

| | | | |
|---|---|---|---|
| 4004626 | 1/1992 | Japan | H04H 9/00 |
| 4217292 | 8/1992 | Japan | G09G 1/04 |

*Primary Examiner*—James J. Groody
*Assistant Examiner*—Chris Grant
*Attorney, Agent, or Firm*—Staas & Halsey

[57] ABSTRACT

A testing apparatus for detecting an image from an image signal in radio waves leaking from an information processing system. The information processing system uses horizontal and vertical synchronizing signals to display the image. The testing apparatus includes a radio wave receiving mechanism which receives the radio waves. An image signal detecting mechanism detects the image signal from the received radio waves and a synchronizing signal receiving mechanism receives the horizontal and vertical synchronizing signals from the information processing system. An image reproducing mechanism reproduces the image from the detected image signal by using the received horizontal and vertical synchronizing signals and a display device is used to display the reproduced image.

31 Claims, 16 Drawing Sheets

TESTING APPARATUS FOR DETECTING AN IMAGE SIGNAL IN RADIO WAVES LEAKING FROM AN INFORMATION PROCESSING SYSTEM

BACKGROUND OF THE INVENTION

1. Field of the invention

The present invention relates to a testing apparatus for detecting an image signal in radio waves leaking from an information processing system such as a computer system. More particularly, the present invention is concerned with a testing apparatus for detecting an image signal in radio waves leaking from an information processing system that includes an image signal detecting device which detects an image signal to be displayed on a visual display device included in the information processing system by checking radio waves leaking out from the information processing system, and an image reproducing device which reproduces the image to be displayed on the visual display device using the detected image signal, and that performs a test to see if an image to be displayed on the visual display device can be intercepted and viewed by stealth.

2. Description of the Related Art

In general, a plurality of radio waves, which are modulated according to the timing for transmitting an image signal, can leak out from a display unit of a computer system, other units coupled to the computer system, or connecting cables thereof. Though very weak, these leakage radio waves contain image information. Accordingly, if such radio waves are intercepted by using a high-sensitivity antenna or receiver by a third party, the third party can then process the waves to reproduce image information. This leads to information leakage. A testing apparatus for detecting an image signal in a radio wave leaking from an information processing system is used for checking if an image signal can be intercepted and if the image can be reproduced by stealth.

Accordingly, it is desired to provide an effective apparatus for checking whether or not image information contained in leakage radio waves existent in an information processing system such as a computer system may be intercepted for viewing by stealth.

In the past, a testing apparatus for detecting an image signal in radio waves leaking from an information processing system, shown in FIG. 1, has been available.

As shown in FIG. 1, reference numeral 1 denotes an information processing system to be tested for leakage radio waves containing an image signal and 3 denotes a testing apparatus for detecting an image signal in radio waves leaking from the information processing system 1.

The information processing system 1 includes a personal computer 11 and a visual display unit such as a CRT (cathode ray tube) connected by a connecting cable 11a. Radio waves containing an image signal are leaking from the VDU (visual display unit) 2 or the connecting cable 11a.

The conventional testing apparatus 3 for detecting an image signal in radio waves leaking from an information processing system 1 comprises an antenna 4, a pre-amplifier 13, a receiver and visual display unit 5, a vertical synchronizing signal oscillator 82, and a horizontal synchronizing signal oscillator 81. The antenna 4 detects the radio waves leaking from the information processing system 1. The receiver and visual display unit 5, which can be made by reorganizing a television set, reproduces the image to be displayed on the VDU 2 of the information processing system 1 from the detected image signal. The horizontal synchronizing signal oscillator 81 generates a horizontal synchronizing signal which is required to synchronize the horizontal image scanning in the information processing system 1. The vertical synchronizing signal oscillator 82 generates a vertical synchronizing signal which is also required to synchronize the image scanning in the information processing system 1. The phase of the horizontal synchronizing signal oscillator 81 and the vertical synchronizing signal oscillator 82 is adjusted by an operator to reproduce the detected image.

The conventional testing apparatus 3 for detecting an image signal in radio waves leaking from an information processing system 1 is operated as described below.

The personal computer 11 is leaking out radio waves that are modulated in amplitude according to screen information. The radio waves do not contain any synchronizing signal. An ordinary television broadcast wave contains both an image signal and a synchronizing signal.

Radio waves received by the antenna 4 are amplified by a pre-amplifier 13, and then fed to an antenna terminal of the receiver and visual display unit 5. The receiver and visual display unit 5 processes the radio wave according to a procedure similar to that for an ordinary television broadcast wave. Since no synchronizing signal is included, a synchronizing signal must be supplied.

The horizontal and vertical synchronizing signal oscillators 81 and 82 supply synchronizing signals adjusted by an operator. The adjusted synchronizing signals are further adjusted to be fully consistent in frequency and phase with those in the personal computer 11, whereby a display screen of the personal computer 11 is reproduced.

In the conventional testing apparatus 3 for detecting an image signal in radio waves leaking from an information processing system 1, if only leakage radio waves can be received, image information of the computer system 1, which is composed of the personal computer 11 and VDU 2, can be intercepted for viewing by stealth. To reproduce an image, the synchronizing signals generated by the horizontal synchronizing signal oscillator 81 and vertical synchronizing signal oscillator 82 must be adjusted so that the synchronizing signals will be precisely consistent in frequency and phase with those used by the computer system 1.

This adjustment is rather hard or complicated to do for an ordinary person. Accordingly, this testing must be entrusted to a specialized agency having advanced technologies for stealth-view interception.

Even when precise synchronizing signals are generated, it is impossible to fully accord the phase of the generated signals with those in the information processing system 1. The display positions of reproduced screens shift as time passes.

SUMMARY OF THE INVENTION

Accordingly, an object of the present invention is to provide a testing apparatus which can detect an image signal in radio waves leaking from an information processing system without hard or complicated operation by the operator, by fetching synchronizing signals directly or indirectly from the information processing system, thereby enabling an easy, precise, and quick checking of the leakage of image data by an ordinary operator.

Another object of the present invention is to help manufacturers of information processing systems develop a technology for preventing image interception for viewing by stealth or to improve testing efficiency.

Yet another object of the present invention is to generate stable reproduced screens.

According to a first aspect of the present invention, there is provided a testing apparatus for detecting an image signal in radio waves leaking from an information processing system that includes an image signal detecting means which detects an image signal from radio waves leaking out of the information processing system, and an image reproducing means which reproduces the image to be displayed on the display means using the detected image signal, and that performs a test to see if an image to be displayed on the display means may be intercepted for viewing by stealth. The testing apparatus further includes a synchronizing signal direct receiving means over which synchronizing signals for use in displaying an image on the display means are directly fetched from the information processing system and transmitted to the image reproducing means.

According to a second aspect of the present invention, there is provided a testing apparatus for detecting an image signal in radio waves leaking from an information processing system that includes an image signal detecting means which detects an image signal from radio waves leaking out of the information processing system, and an image reproducing means which reproduces the image to be displayed on the display means using the detected image signal, and that performs a test to see if an image to be displayed on the display means may be intercepted for viewing by stealth. The testing apparatus further includes a synchronizing signal indirect receiving means over which synchronizing signals for use in displaying an image on the display means are indirectly fetched from the information processing system and transmitted to the image reproducing means.

According to a third aspect of the present invention, there is provided a testing apparatus for detecting an image signal in radio waves leaking from an information processing system that includes an image signal detecting means which detects an image signal from radio waves leaking out of the information processing system, and an image reproducing means which reproduces the image to be displayed on the display means using the detected image signal, and that performs a test to see if an image to be displayed on the display means can be intercepted for viewing by stealth. The testing apparatus further includes a pseudo-synchronizing signal generating means that generates pseudo-synchronizing signals having at least the same periods as the synchronizing signals for use in displaying an image on the display means and that transfers the pseudo-synchronizing signals to the image reproducing means.

According to a fourth aspect of the present invention, there is provided a testing apparatus for detecting an image signal in radio waves leaking from an information processing system having the same components as that in the first aspect of the present invention and further including an image pattern storage means which stores a predetermined image pattern, and an image pattern comparing means that when the image pattern is displayed on the display means, after the image reproducing means reproduces an image pattern detected by the image signal detecting means as an image according to the synchronizing signals provided by the synchronizing signal transmitting means, compares the reproduced image with the image pattern stored in the image pattern storage means, and when the reproduced image agrees with the stored image pattern, outputs a signal indicating that radio waves may be intercepted for viewing by stealth.

In the first aspect of the present invention, the image signal detecting means detects an image signal by checking radio waves leaking out when an image is to be displayed on the display means of the information processing system.

The image signal detecting means may be, for example, an antenna for detecting electro-magnetic waves that propagate in the air, or may be a means for directly detecting a voltage of a power supply distorted by an image signal.

The "image signal" refers to red, green, and blue signals on the assumption that the display means performs color display.

The image reproducing means in this aspect of the present invention uses the image signal detected by the image signal detecting means, references the synchronizing signals transmitted over the synchronizing signal transmitting means and directly used by the information processing system, and then reproduces an image.

In the first aspect, unlike the conventional testing apparatus for detecting an image signal in radio waves leaking from an information processing system, when the image reproducing means reproduces an image, horizontal and vertical synchronizing signals need not be adjusted before being supplied. The synchronizing signals are directly or indirectly fetched from the information processing system via the synchronizing signal direct receiving means or the synchronizing signal indirect receiving means. Synchronizing signals which are identical to or consistent in phase and frequency with those used in the information processing system, can therefore be employed. The image reproducing means can therefore easily and precisely reproduce an image using leakage waves of an image without any adjustment.

In the second aspect of the present invention, unlike the first aspect, the synchronizing signal transmitting means is not used to fetch the synchronizing signals directly but the pseudo-synchronizing signal generating means is used to generate pseudo-synchronizing signals having at least the same periods as those used in the information processing system whose radio waves may be intercepted for viewing by stealth.

The pseudo-synchronizing signal generating means may, for example, be a personal computer of the same model as a personal computer included in the information processing system.

In this aspect, however, the phases of the synchronizing signals must be adjusted.

In the third aspect of the present invention, unlike the first aspect, a tester neither checks the result of reproduction provided by the image reproducing means nor determines whether stealth-view interception may occur. The image pattern storage means and image pattern comparing means are employed, whereby it is determined automatically whether stealth-view interception may occur.

In this aspect, a test image pattern is pre-programmed. The test image pattern is displayed on the display means of the information processing system and stored in the image pattern storage means. The image pattern comparing means compares an image pattern reproduced by the image reproducing means with the stored image pattern, determines whether stealth-view interception may occur, and then outputs the result.

As described so far, according to the present invention, synchronizing signals can be fetched from an information processing system that is tested to see if radio waves may be intercepted for viewing by stealth. An image signal detected in a leakage radio wave is reproduced according to the synchronizing signals.

Whether the image information contained in the leakage radio waves may be intercepted for viewing by stealth can therefore be checked easily, precisely, and quickly with a simple configuration and without an expert's adjustment. The present invention would help manufacturers of information processing systems develop a technology for preventing stealth-view interception of images and improve testing efficiency.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

A preferred embodiment according to the present invention will be explained hereinafter with reference to the attached drawings.

Figure 1:
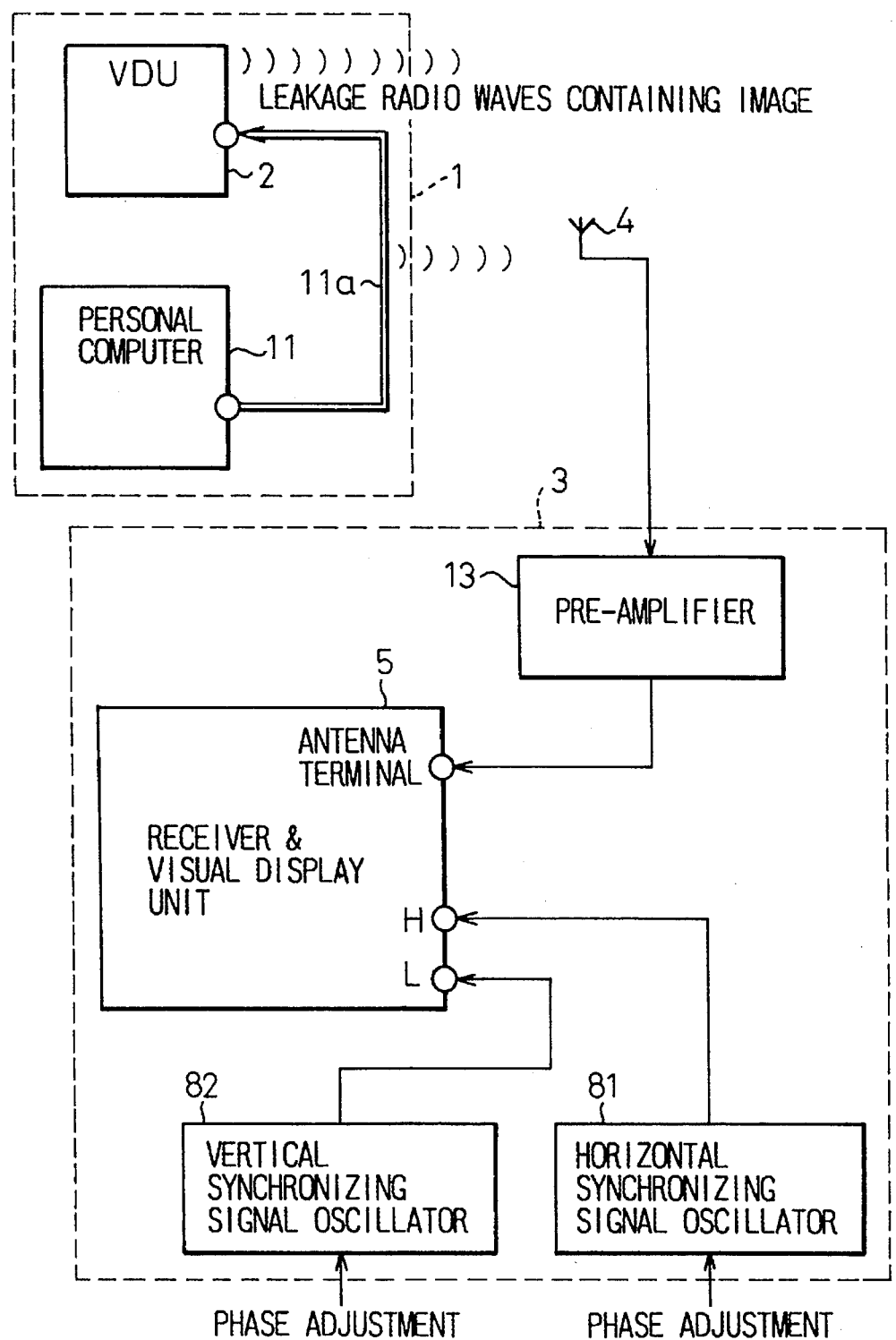
FIG. 1 is a block diagram showing an example of the structure of a conventional testing apparatus for detecting an image signal in radio waves leaked from an information processing system.
Figure 2:
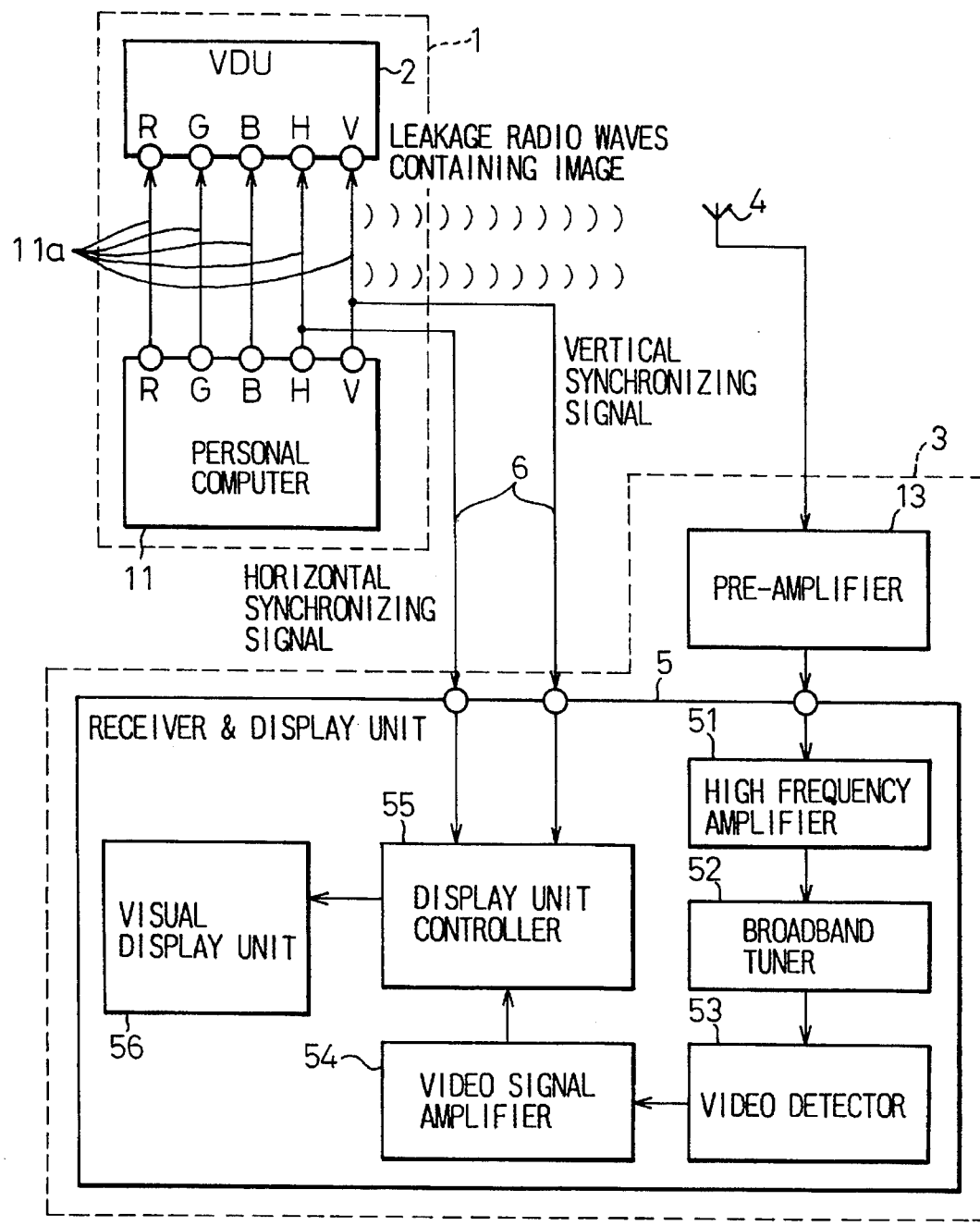
FIG. 2 is a block circuit diagram showing a structure of a first embodiment of a testing apparatus for detecting an image signal in radio waves leaked from an information processing system according to the present invention.

FIG. 2 is a block circuit diagram showing a construction of a testing apparatus for detecting an image signal in radio waves leaking from an information processing system according to the first embodiment of the present invention. In FIG. 2, the elements that have the same functions as elements in FIG. 1 are assigned the same reference numerals.

Accordingly, in FIG. 2, reference numeral 1 denotes an information processing system to be tested for a leakage radio waves containing an image signal, 2 denotes a visual display unit (VDU) such as a CRT (cathode ray tube), 3 denotes a testing apparatus for detecting an image signal in radio waves leaking from the information processing system 1, 4 denotes an antenna, 5 denotes a receiver and visual display unit 5, and 11 denotes a personal computer.

In the information processing system 1, the personal computer 11 and the VDU 2 are connected by a connecting cable 11a. The connecting cable 11a in this embodiment includes cables for red, green, and blue signals, and cables for a horizontal and vertical synchronizing signals, since the VDU 2 is a color display. Radio waves containing an image signal are leaking from the VDU 2 or the connecting cable 11a.

The testing apparatus 3 for detecting an image signal in radio waves leaking from an information processing system 1 comprises an antenna 4, a pre-amplifier 13, and a receiver and visual display unit 5. The antenna 4 detects the radio waves leaking from the information processing system 1, and the pre-amplifier amplifies the detected radio waves. It is essential to use a broadest possible band of frequencies, so that the radio wave interception testing apparatus can faithfully reproduce an image originating from the information processing system 1. Accordingly, the receiver and visual display unit 5, which can be made by reorganizing a television set, includes a high-frequency amplifier 51, a broadband tuner 52, a video detector 53, a video signal amplifier 54, a display unit controller 55, and a visual display unit 56. The high frequency amplifier 51 amplifies a signal sent from the pre-amplifier 13 in terms of a high-frequency band, the broadband tuner 52 performs tuning in terms of a broader band of frequencies than the one in a normal TV, the video detector 53 detects and samples a video signal, the video signal amplifier 54 amplifies a video signal, and the display unit controler 55 controls an image on the visual display unit 56 synchronously with a horizontal synchronizing signal and a vertical synchronizing signal.

The horizontal and the synchronizing signals in this embodiment are received directly by cables 6. The cables 6 in this embodiment are composed of a cable for transmitting a horizontal synchronizing signal and a cable for transmitting a vertical synchronizing signal. The cables 6 are bifurcated from the connecting cables 11a and coupled with a horizontal synchronizing signal input terminal and a vertical synchronizing signal input terminal of the receiver and display unit 5. Thus, the same horizontal and vertical synchronizing signals can be received by the testing apparatus 3 for detecting an image signal in radio-waves leaking from an information processing system in this embodiment.

In the above embodiment, the antenna 4 detects radio waves that contain an image signal leaking out of the information processing system 1 which is being tested to see if any radio waves may be intercepted for viewing by stealth. The image signal is displayed on the visual display unit 56 in the receiver and visual display unit 5 according to the horizontal and vertical synchronizing signals sent from the information processing system 1 over the cables 6. The visual display may be a CRT (cathode ray tube) or an LCD (liquid crystal display). Thus, the image pattern displayed on the VDU 2 can be reproduced and monitored on the visual display unit 56.

In this way, unlike the prior art, horizontal and vertical synchronizing signal oscillators that must be adjusted by a tester are unnecessary. Thus, a screen can be reproduced using leakage radio waves of an image without any regulation of horizontal and vertical synchronizing signals.

Figure 3:
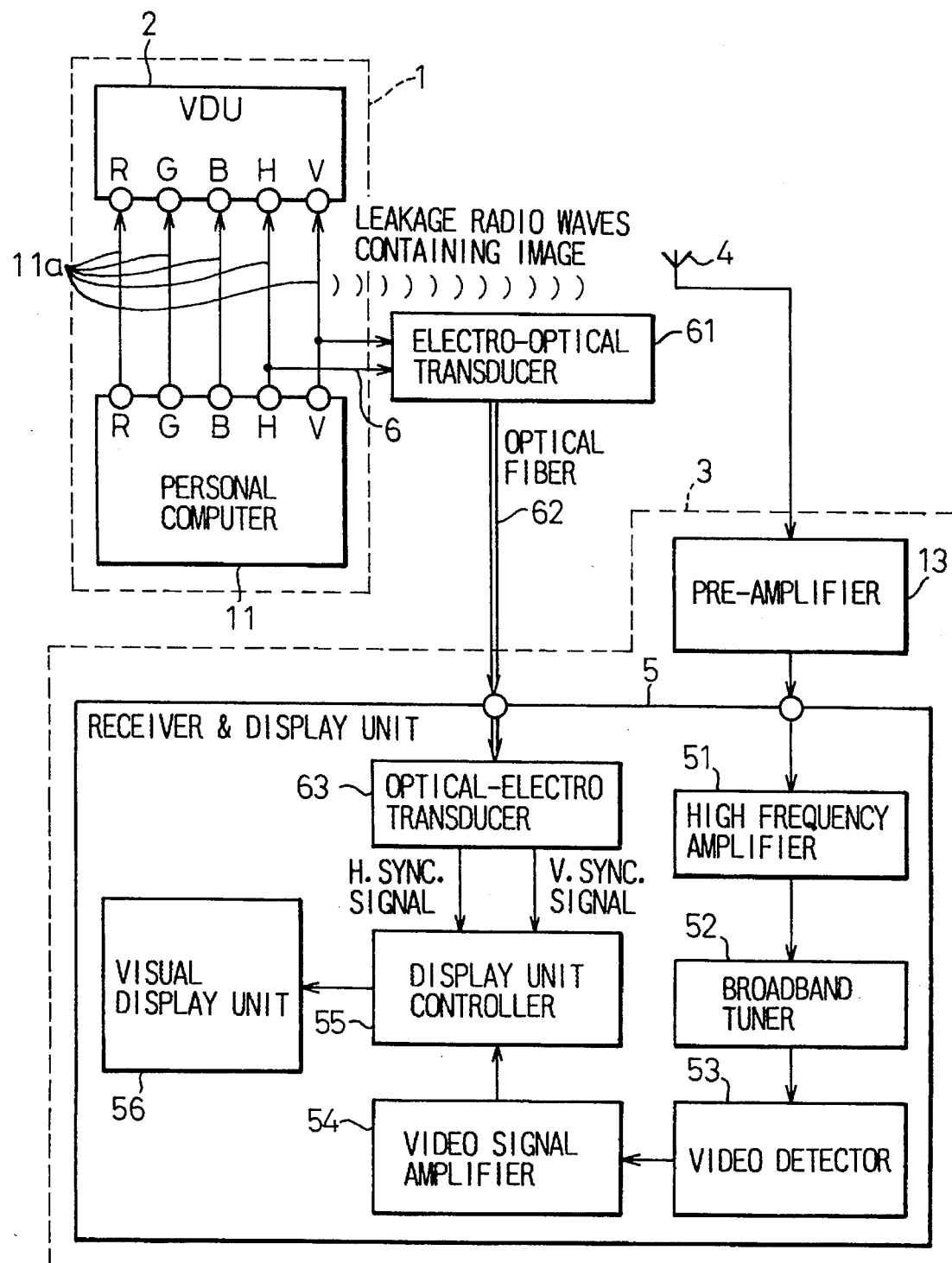
FIG. 3 is a block circuit diagram showing a first modification of the first embodiment shown in FIG. 2.

FIG. 3 is a block circuit diagram showing a first modification of the first embodiment shown in FIG. 2. In this embodiment, the horizontal and vertical synchronizing signals are initially transduced to an optical signal to prevent random external noise from being intercepted. Accordingly, an electro-optical transducer 61 is provided near the information processing system 1, and an optical-electro transducer 63 is provided in the receiver and visual display unit 5. The electro-optical transducer 61 and the optical-electro transducer 63 are connected by an optical fiber 62. The horizontal and vertical synchronizing signals are delivered to the electro-optical transducer 61 via the cables 6, and then transduced to the optical signal and transmitted to the optical-electro transducer 63 via the optical fiber 62. The optical signal is transduced to an electrical signal at the optical-electro transducer 63, and then input to the display unit controller 55 as the horizontal and the vertical synchronizing signals.

The remaining structure of the embodiment in FIG. 3 is the same as the embodiment as shown in FIG. 2, and accordingly an explanation of those elements will be omitted and the same elements will be assigned the same reference numerals.

Figure 4:
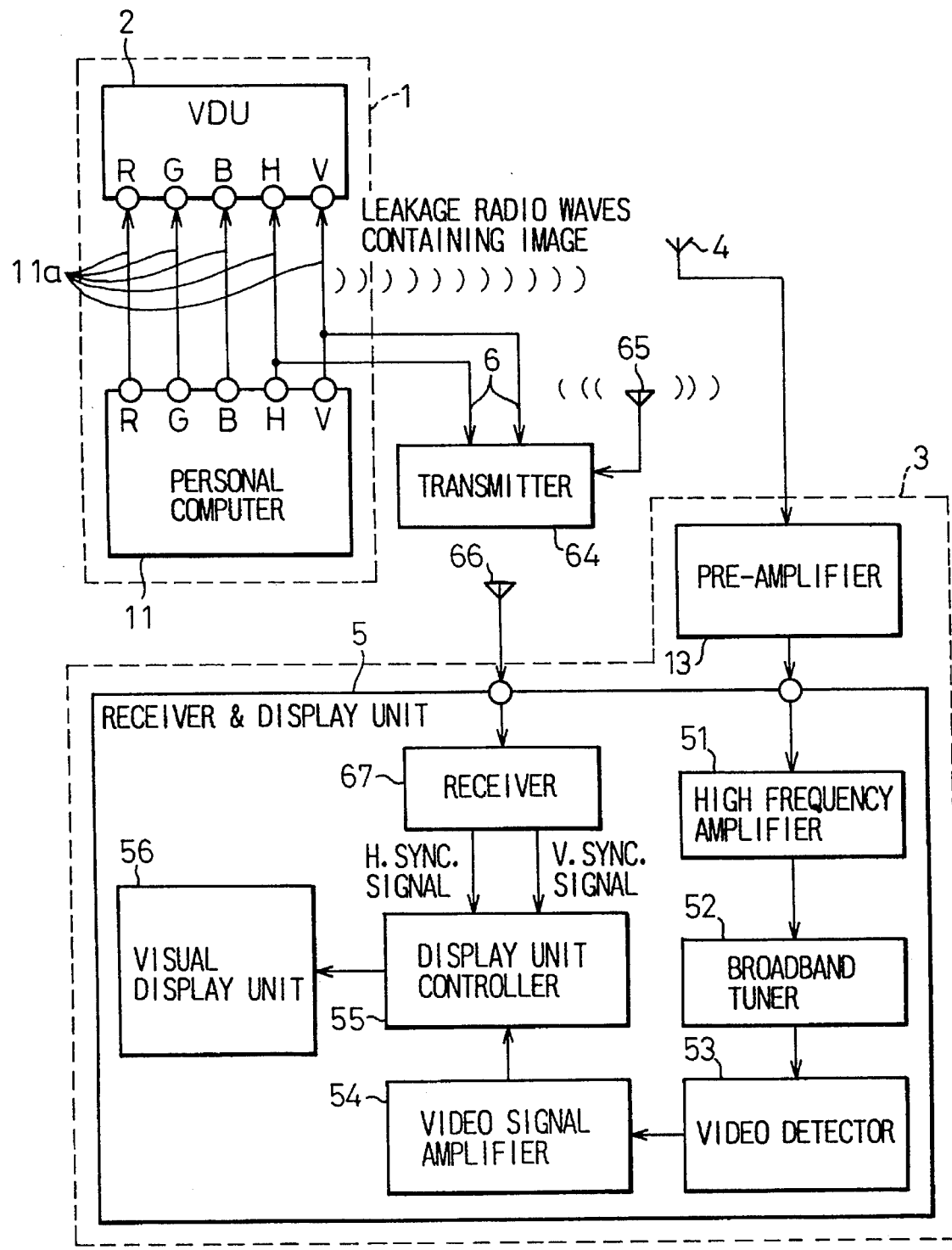
FIG. 4 is a block circuit diagram showing a second modification of the first embodiment shown in FIG. 2.

FIG. 4 is a block circuit diagram showing a second modification of the first embodiment shown in FIG. 2. In this embodiment, the horizontal and vertical synchronizing signals are initially converted to radio waves. Accordingly, a transmitter 64 having a transmitting antenna 65 is provided near the information processing system 1, and a receiver 67 having a receiving antenna 66 is provided in the receiver and visual display unit 5. In this embodiment, the horizontal and vertical synchronizing signals are delivered to the transmitter 64 and then transmitted from the transmitting antenna 65 after the modulation. The radio waves transmitted from the antenna 65 are received by the receiving antenna 66 of the receiver 67. The received signals are demodulated by the receiver 67, and then input to the display unit controller 55 as the horizontal and the vertical synchronizing signals.

As the remaining structure of the embodiment in FIG. 3 is the same as the embodiment as shown in FIG. 2, an explanation thereof will be omitted and the same elements are assigned the same reference numerals.

Figure 5:
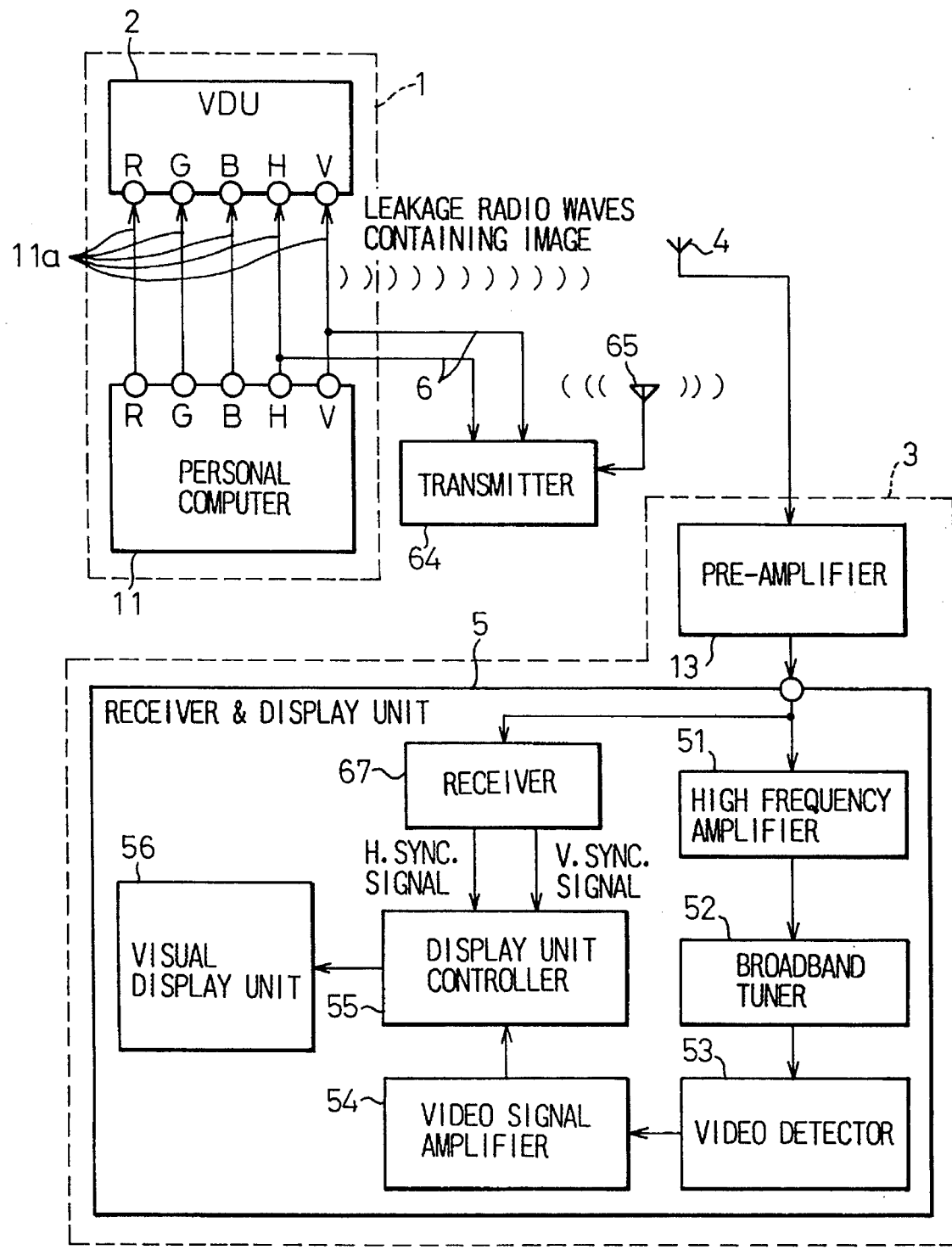
FIG. 5 is a block circuit diagram showing a third modification of the first embodiment shown in FIG. 2.

FIG. 5 is a block circuit diagram showing a third modification of the first embodiment shown in FIG. 2. The structure of the third modification of the first embodiment as shown in FIG. 5 is almost the same as the structure of the second modification as shown in FIG. 4. The only difference between the second modification in FIG. 4 and the third modification in FIG. 5 is that the antenna 4 of the testing apparatus 3 is substituted for the antenna of the receiver 67.

As the remaining structure of the embodiment in FIG. 3 is the same as the embodiment as shown in FIG. 2, an explanation thereof will be omitted and the same elements are assigned the same reference numerals.

Next, the second embodiment will be described in conjunction with FIG. 6.

In the first embodiment, the horizontal and the vertical synchronizing signals are received by the testing apparatus 3 directly by the cables 6. However, in the second embodiment, the horizontal and the vertical synchronizing signals are received by the testing apparatus 3 directly by a synchronizing signal sensing device 7, as shown in FIG. 6. The synchronizing signal sensing device 7 consists mainly of a magnetic sensor 70, which is a loop coil, a waveform shaping circuit 71, and a frequency divider 72. The magnetic sensor 70 senses the occurrence of a magnetic field synchronous with a horizontal synchronizing signal generated by a deflecting coil in the VDU 2 and converting the strength of the magnetic field into an electric signal, the waveform shaping circuit 71 shapes the waveform of the electric signal provided by the magnetic sensor 70 by removing noise from the signal, and the frequency divider 72 divides the frequency of a horizontal synchronizing signal by the number of horizontal scanning lines to produce a vertical synchronizing signal. In this way, the horizontal synchronizing signal is supplied from the waveform shaping circuit 71 to the receive and visual display unit 5, and the vertical synchronizing signal is supplied from the frequency divider 72.

Figure 7A:
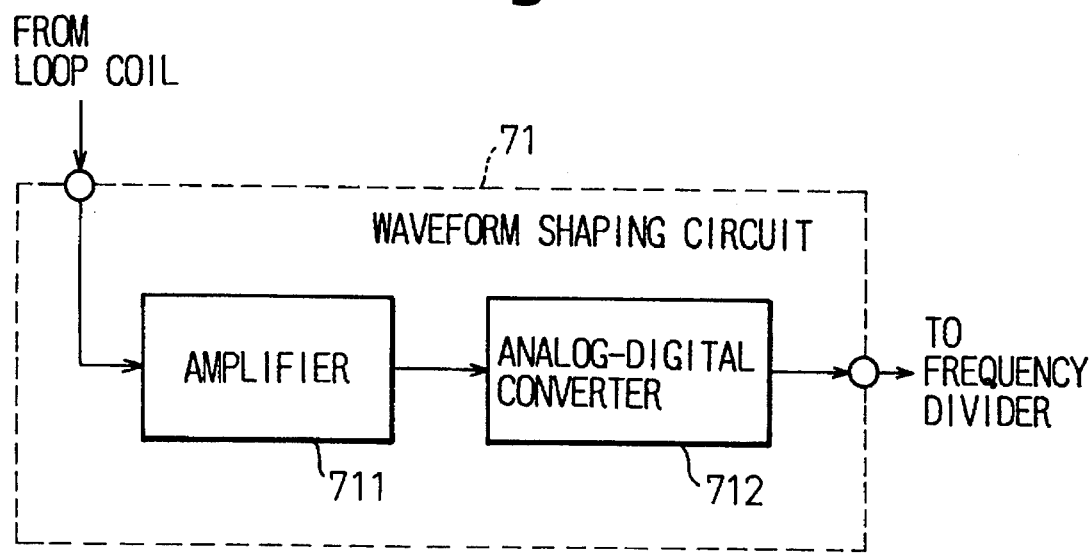
FIG. 7A is a block circuit diagram showing a structure of an example of the waveform shaping circuit in FIG. 6.
Figure 7B:
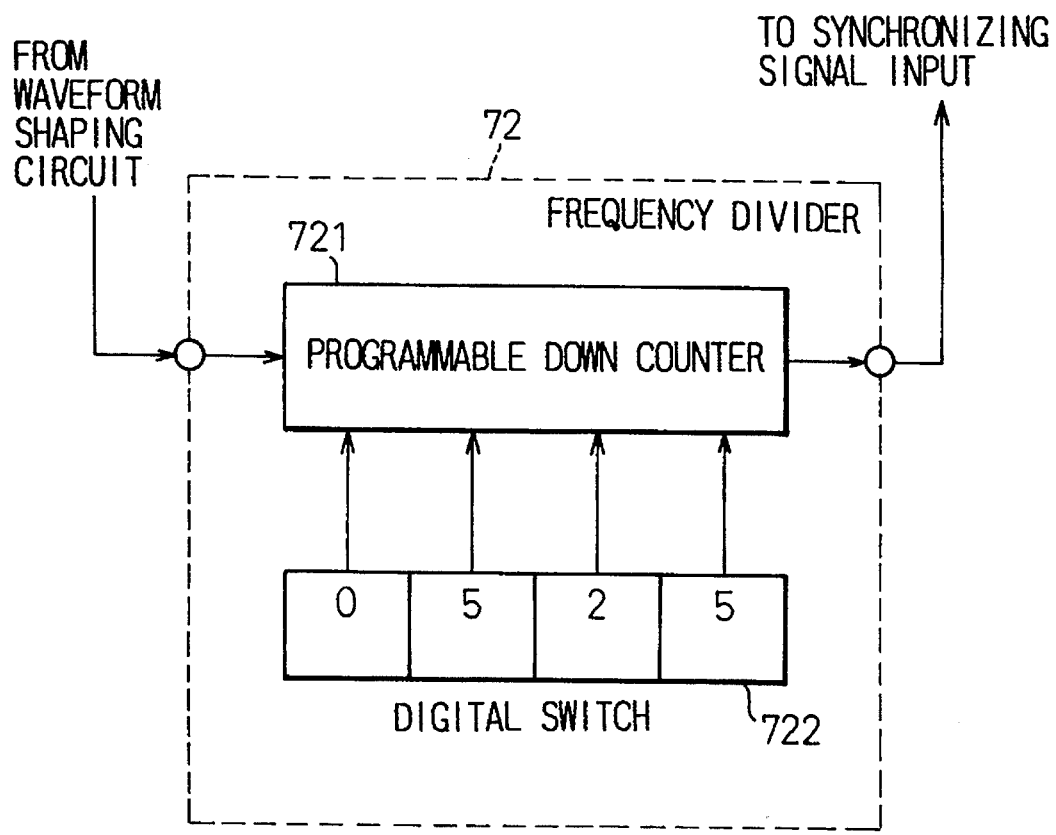
FIG. 7B is a block circuit diagram showing a structure of an example of the frequency divider in FIG. 6.

FIGS. 7A and 7B show an example of the construction of the waveform shaping circuit 71 and the frequency divider 72.

In FIG. 7A, the waveform shaping circuit 71 is composed of an amplifier 711 for amplifying a voltage sensed by the magnetic sensor 70, and an analog-digital converter 712 for converting the amplified voltage from an analog value to a digital value.

In FIG. 7B, the frequency divider 72 is composed of a digital switch 722 for setting a number n for dividing a frequency, and a programmable down counter 721 that counts the set (n) number of pulses.

Figure 6:
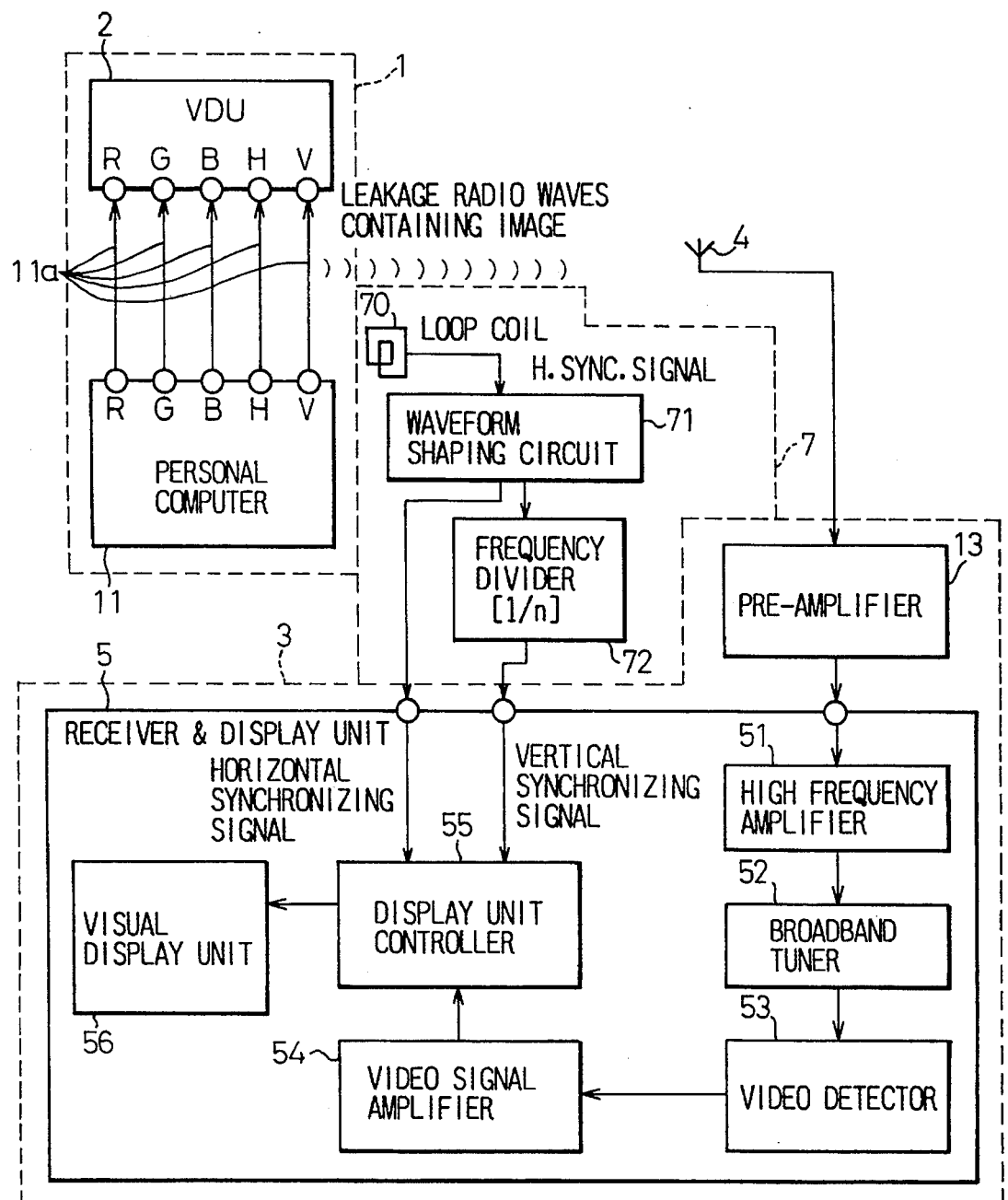
FIG. 6 is a block circuit diagram showing a structure of a second embodiment of a testing apparatus for detecting an image signal in radio waves leaked from an information processing system according to the present invention.

As the remaining structure of the embodiment in FIG. 6 is the same as the embodiment as shown in FIG. 2, an explanation thereof will be omitted and the same elements are assigned the same reference numerals.

In the second embodiment, the magnetic sensor 70 detects a magnetic field irradiated by the deflecting coil that deflects an electron beam in the VDU 2 of the computer system 1. The waveform of the detected signal is shaped by the waveform shaping circuit 71, whereby a horizontal synchronizing signal is produced and then fed to the receiver and visual display unit 5. The frequency of the horizontal synchronizing signal is divided by the number of horizontal scanning lines by means of the frequency divider 72, whereby a vertical synchronizing signal is produced and visual then fed to the receiver and display unit 5.

In the second embodiment, unlike the first embodiment, leakage radio waves of an image can be reproduced without touching the personal computer 11 in the information processing system 1. Testing can therefore be automated. Similarly to the first embodiment, horizontal and vertical synchronizing signals need not be adjusted.

Figure 8:
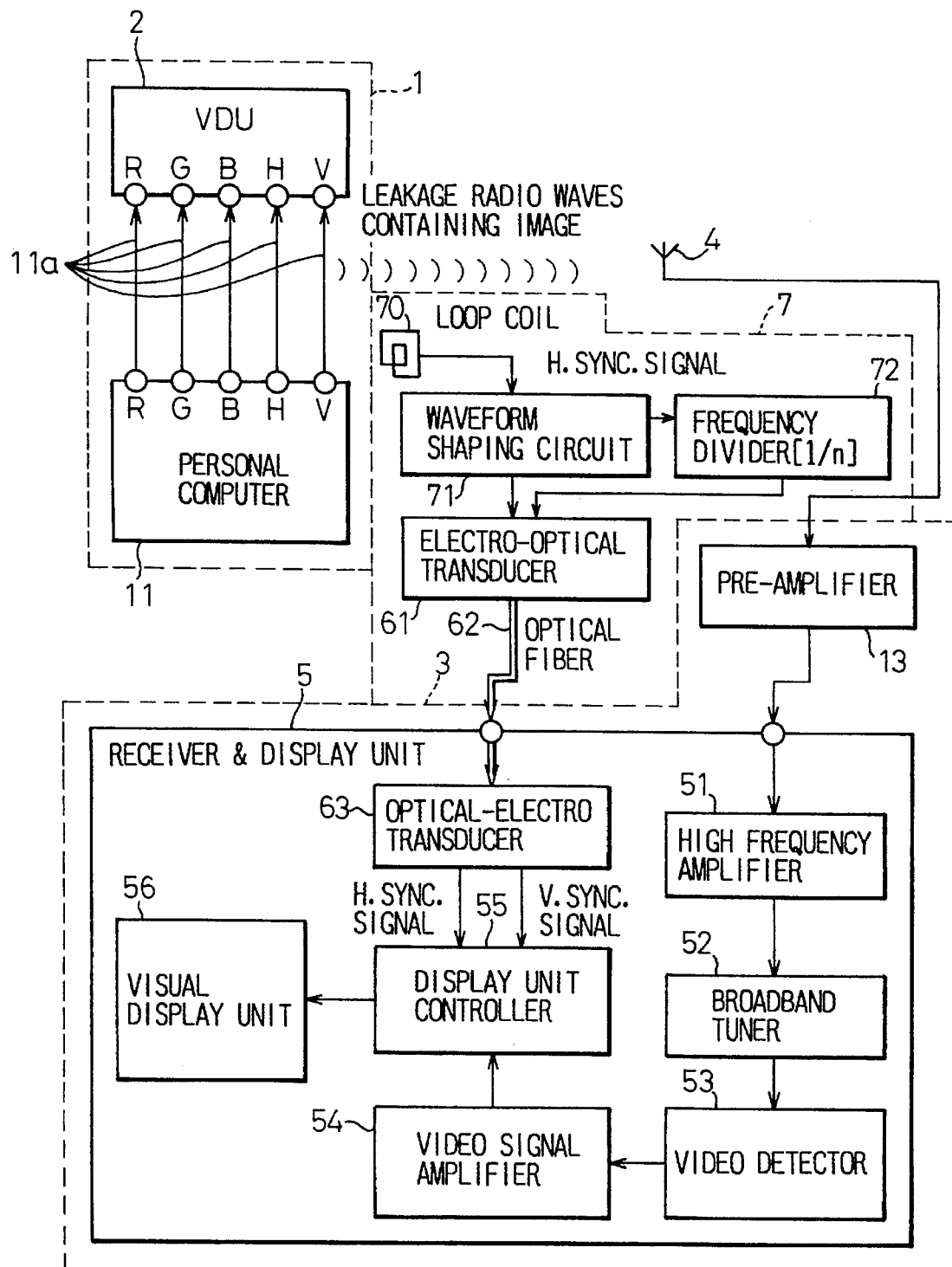
FIG. 8 is a block circuit diagram showing a first modification of the second embodiment shown in FIG. 6.

FIG. 8 is a block circuit diagram showing a first modification of the second embodiment shown in FIG. 6. In this embodiment, the horizontal and vertical synchronizing signals are initially transduced to an optical signal to prevent random external noise from being intercepted. Accordingly, an electro-optical transducer 61 is provided next to the waveform shaping circuit 71 and the frequency divider 72, and an optical-electro transducer 63 is provided in the receiver and visual display unit 5. The electro-optical transducer 61 and the optical-electro transducer 63 are connected by an optical fiber 62. The horizontal and vertical synchronizing signals are delivered to the electro-optical transducer 61 from the waveform shaping circuit 71 and the frequency divider 72, and then transduced to the optical signal and transmitted to the optical-electro transducer 63 via the optical fiber 62. The optical signal is transduced to an electrical signal at the optical-electro transducer 63, and then input to the display unit controller 55 as the horizontal and the vertical synchronizing signals.

As the remaining structure of the embodiment in FIG. 8 is the same as the embodiment as shown in FIG. 6, an explanation thereof will be omitted and the same elements are assigned the same reference numerals.

Figure 9:
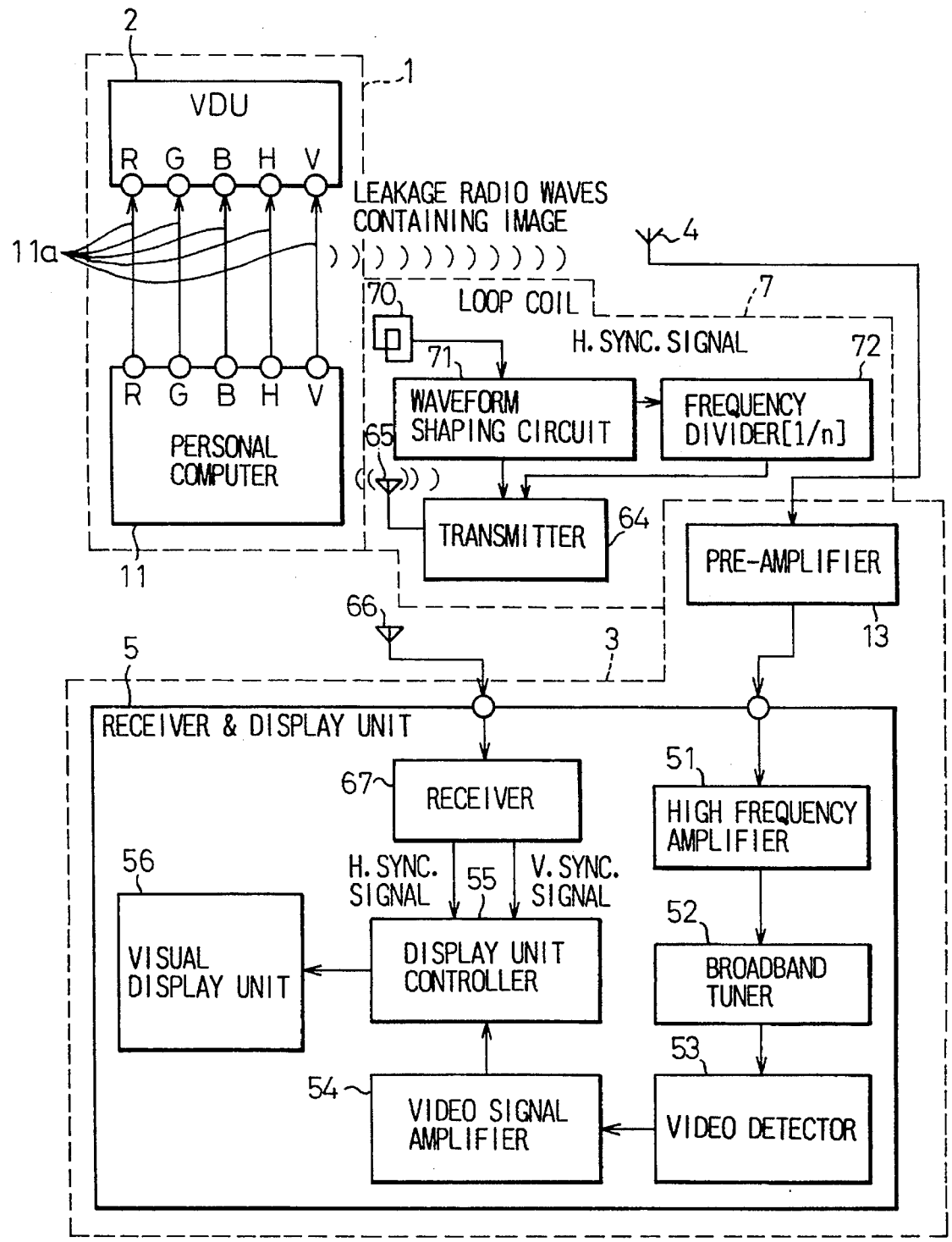
FIG. 9 is a block circuit diagram showing a second modification of the second embodiment shown in FIG. 6.

FIG. 9 is a block circuit diagram showing a second modification of the second embodiment shown in FIG. 6. In this embodiment, the horizontal and vertical synchronizing signals are initially converted to radio waves. Accordingly, a transmitter 64 having a transmitting antenna 65 is provided next to the waveform shaping circuit 71 and the frequency divider 72, and a receiver 67 having a receiving antenna 66 is provided in the receiver and visual display unit 5. In this embodiment, the horizontal and vertical synchronizing signals are delivered to the transmitter 64 from the waveform shaping circuit 71 and the frequency divider 72, and then transmitted from the transmitting antenna 65 after the modulation. The radio waves transmitted from the antenna 65 are received by the receiving antenna 66 of the receiver 67. The received signals are demodulated by the receiver 67, and then input to the display unit controller 55 as the horizontal and the vertical synchronizing signals.

As the remaining structure of the embodiment in FIG. 9 is the same as the embodiment as shown in FIG. 6, an explanation thereof will be omitted and the same elements are assigned the same reference numerals.

Figure 10:
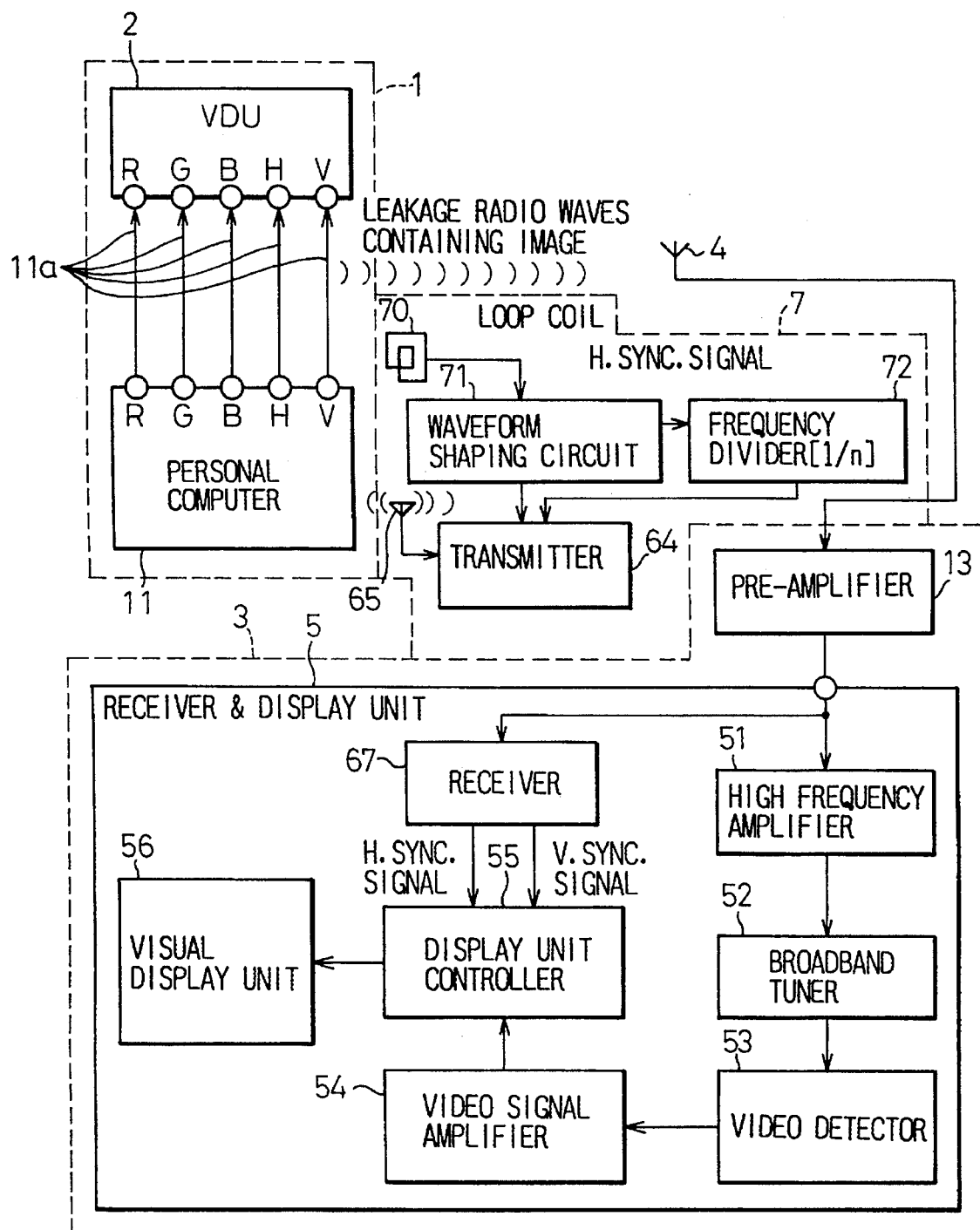
FIG. 10 is a block circuit diagram showing a third modification of the second embodiment shown in FIG. 6.

FIG. 10 is a block circuit diagram showing a third modification of the second embodiment shown in FIG. 6. The structure of the third modification of the second embodiment as shown in FIG. 10 is almost the same as the structure of the second modification as shown in FIG. 9. The only difference between the second modification in FIG. 9 and the third modification in FIG. 10 is that the antenna 4 of the testing apparatus 3 is substituted for the antenna of the receiver 67.

As the remaining structure of the embodiment in FIG. 10 is the same as the embodiment as shown in FIG. 9, an explanation thereof will be omitted and the same elements are assigned the same reference numerals.

Figure 11:
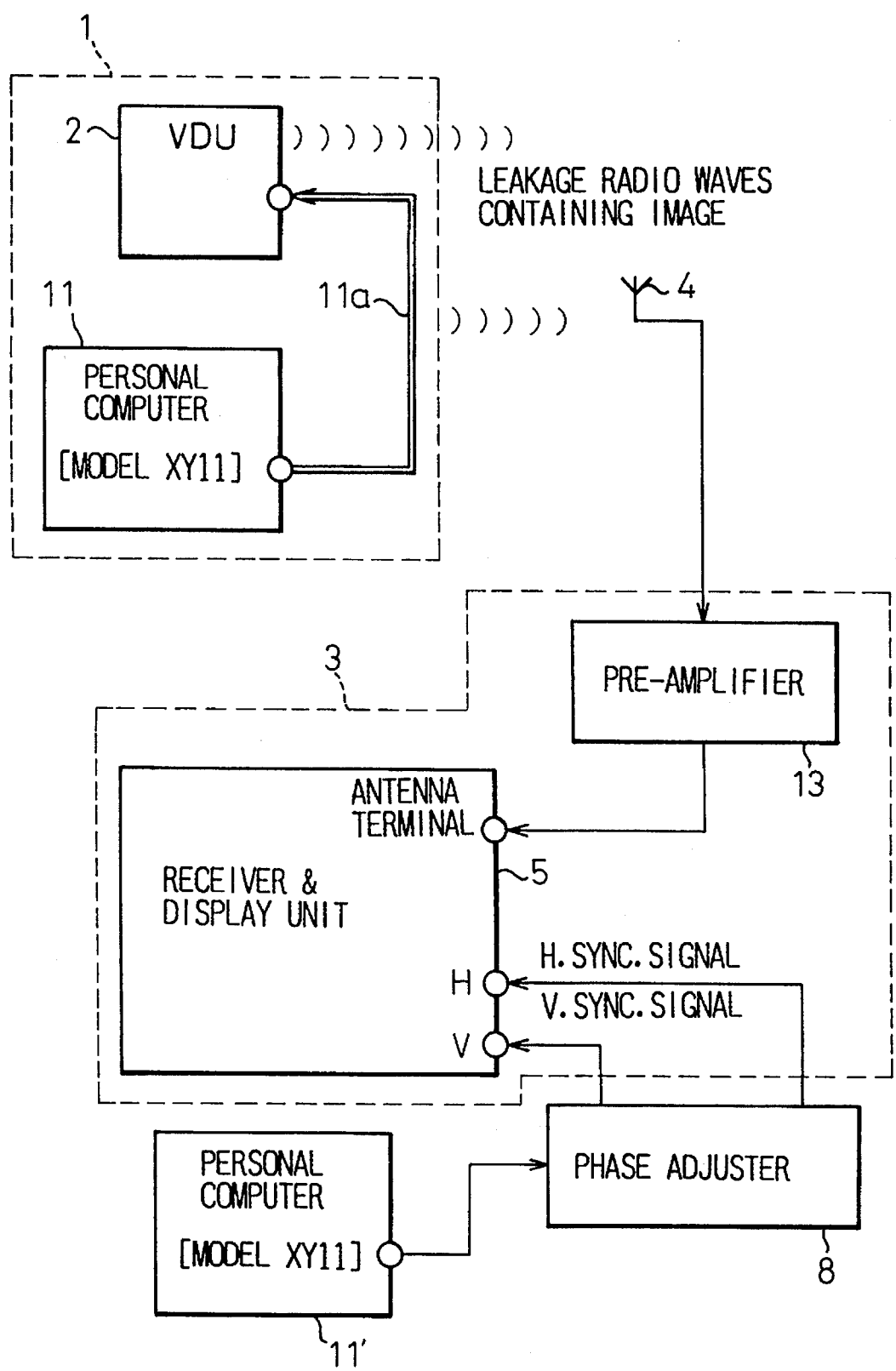
FIG. 11 is a block circuit diagram showing a structure of a third embodiment of a testing apparatus for detecting an image signal in radio waves leaked from an information processing system according to the present invention.

Next, the third embodiment will be described in conjunction with FIG. 11.

In the first and the second embodiment, the horizontal and the vertical synchronizing signals to reproduce the image are directly or indirectly received from the information processing system 1. However, in the third embodiment, the horizontal and the vertical synchronizing signals are not obtained directly or indirectly from the information processing system 1 by using cables 6 or a magnetic sensor 70. That is, the horizontal and the vertical synchronizing signals in the third embodiment are obtained from the pseudo-synchronizing signal generating device 11' provided independently from the information processing system 1.

The pseudo-synchronizing signal generating device 11' is comprised of a personal computer 11' that is of the same model by the same manufacturer as a personal computer 11 installed in the information processing system 1. Since the computer of the same model has the same horizontal and the vertical synchronizing signals defined under the same specifications, the horizontal and the vertical synchronizing signals can be used to reproduce the image detected from the information processing system 1 without adjusting the frequency and the level thereof. However, the phases of the synchronizing signals must be adjusted. Accordingly, the horizontal and the vertical synchronizing signals are input to the receiver and visual display unit 5 after an adjustment of the phase by a phase adjuster 8. The phase adjuster 8 may adjust the phase of the horizontal and the vertical synchronizing signals automatically.

In the third embodiment, synchronizing signals can be produced without touching the personal computer 11 that is an object to be tested. Testing can therefore be automated. Furthermore, the configuration of the apparatus is simple.

Next, the fourth embodiment will be described in conjunction with FIG. 12A and 12B.

Figure 12A:
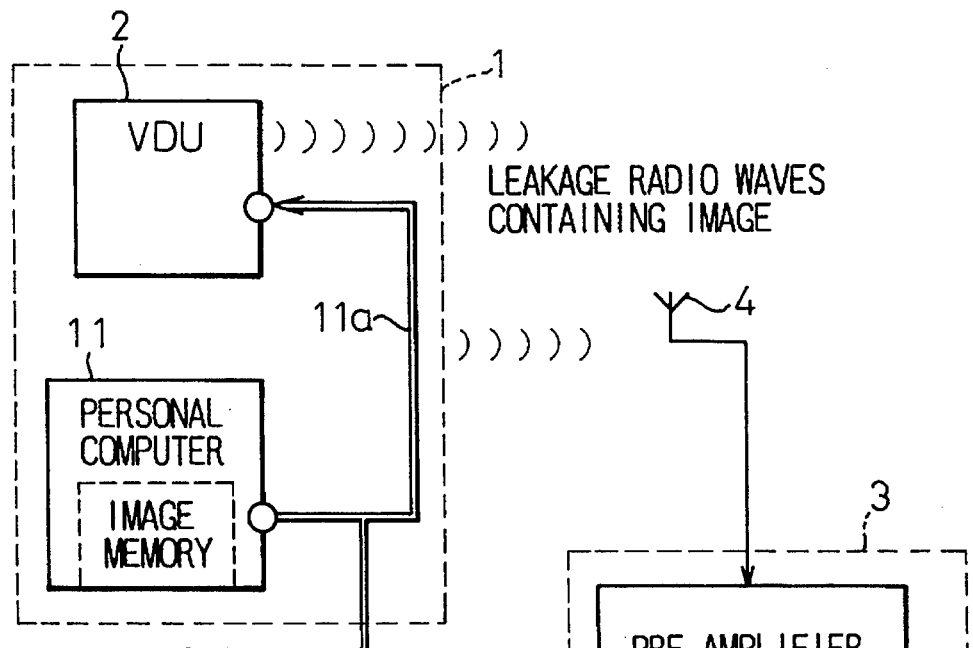
FIG. 12A is a block circuit diagram showing a structure of a fourth embodiment of a testing apparatus for detecting an image signal in radio waves leaked from an information processing system according to the present invention.

As shown in FIG. 12A, unlike the first to third embodiments, this embodiment has the same configuration as the first or second embodiment and further includes an image memory 9 and an image pattern comparator 91. The image memory 9 stores a predetermined image pattern to be displayed on the VDU 2. The image pattern is, for example, as shown in FIG. 12B, and is stored both in the image memory in the personal computer 11 of the information processing system 1 and the image memory 9 added to the testing apparatus 3. And the image pattern comparator 91 compares an image, which is reproduced in the visual display unit of the receiver and visual display unit 5 after being detected through the antenna 4 in accordance with the synchronizing signals received by the cables 6, with the image pattern stored in the image memory 9.

When the reproduced image agrees with the stored image pattern, the image pattern comparator 91 outputs an images-consistent information signal indicating that radio waves may be intercepted for viewing by stealth.

Figure 12B:
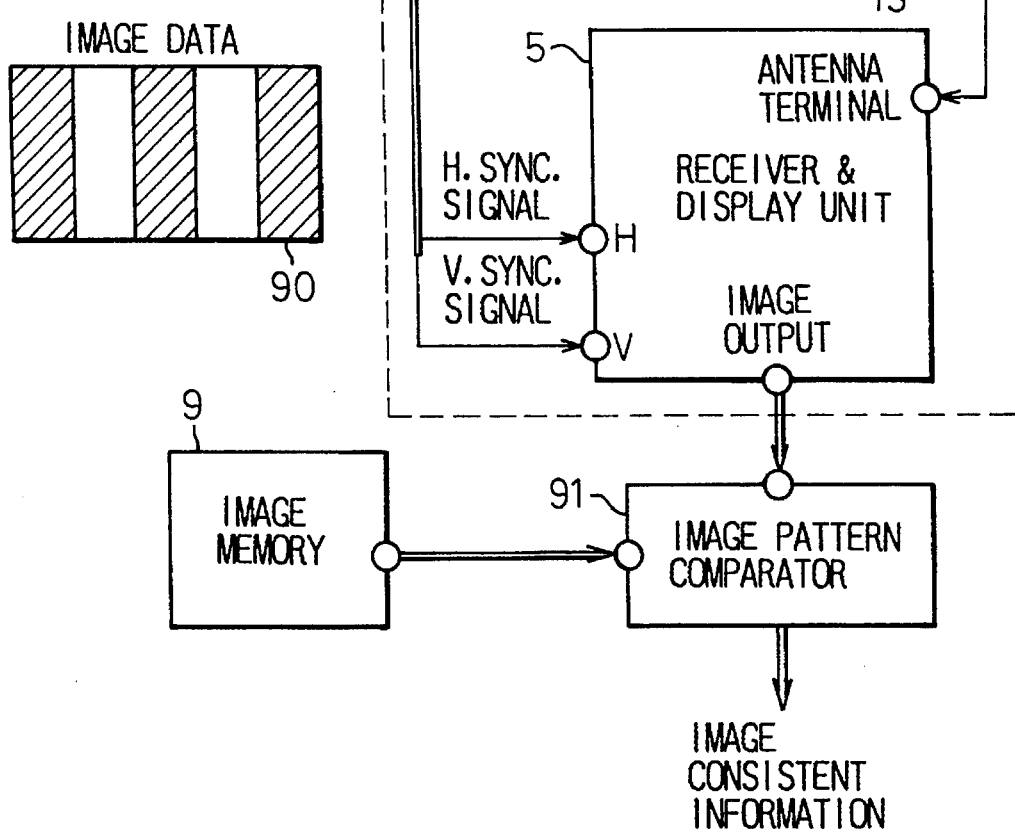
FIG. 12B is one example of image data stored in an image memory.

In the fourth embodiment, as shown in FIG. 12B, a black-and-white striped pattern 90 is used as the image pattern. The black-and-white striped pattern 90 is not only displayed on the VDU 2 of the information processing system 1 but is also previously stored in the image memory 9.

Figure 13A:
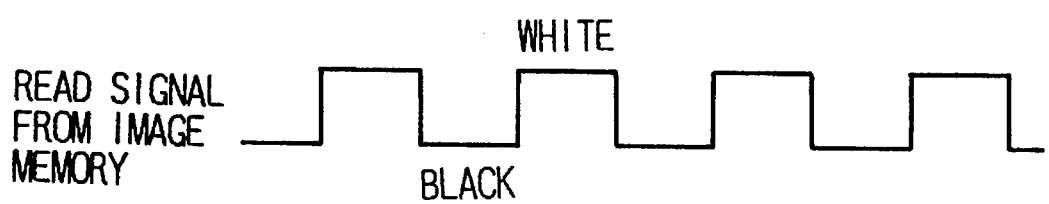
FIG. 13A is a waveform diagram showing a read signal from the image memory in FIG. 12A.
Figure 13B:
FIG. 13B is a waveform diagram showing an output signal from the receiver and display unit in FIG. 12A.

The image pattern is detected as an image signal through the antenna 4, and then reproduced in the receiver and visual display unit 5 according to the synchronizing signals received by the cables 6. The image reproduced in the receiver and visual display unit 5 is fed as a signal shown in FIG. 13B to the image pattern comparator 91, and compared with a signal, which is shown in FIG. 13A, read from the image memory 9. As a result of the comparison, if the signals agree with each other, the images-consistent information signal is output to indicate that radio waves may be intercepted for stealthy view.

In the fourth embodiment, a tester operator need not view a screen to determine whether radio waves may be intercepted for viewing by stealth. Owing to the image memory 9 and image pattern comparator 91, it can be determined automatically whether radio waves may be intercepted for viewing by stealth. An objective and reliable test result can therefore be provided with ease without human interruption.

Figure 14:
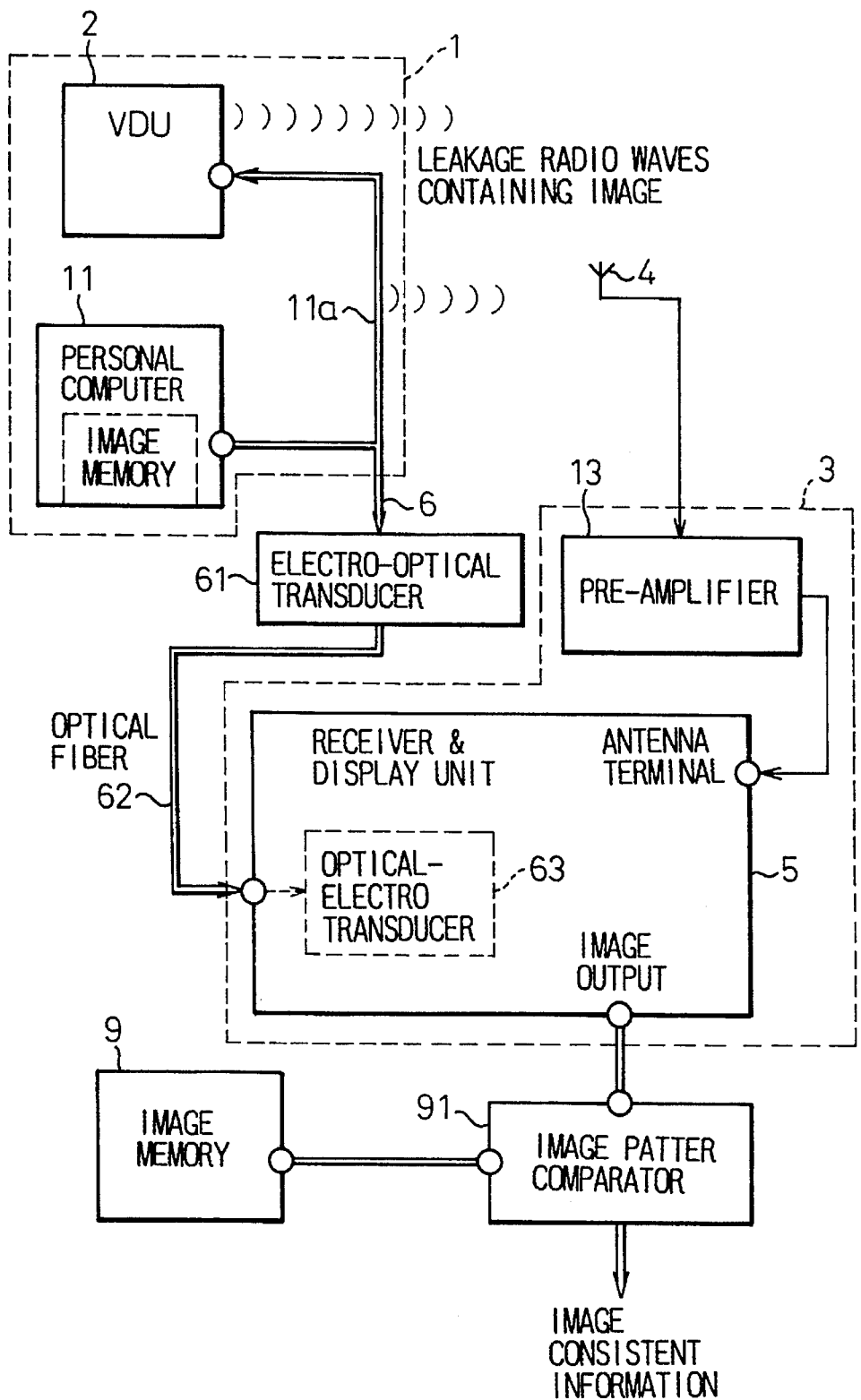
FIG. 14 is a block circuit diagram showing a first modification of the fourth embodiment shown in FIG. 12A.

FIG. 14 is a block circuit diagram showing a first modification of the fourth embodiment shown in FIG. 12A. In this embodiment, the horizontal and vertical synchronizing signals are initially transduced to an optical signal to prevent random external noise from being intercepted. Accordingly, an electro-optical transducer 61 is provided near the information processing system 1, and an optical-electro transducer 63 is provided in the receiver and visual display unit 5. The electro-optical transducer 61 and the optical-electro transducer 63 are connected by an optical fiber 62. The horizontal and vertical synchronizing signals are delivered to the electro-optical transducer 61 via the cables 6, and then transduced to an optical signal and transmitted to the optical-electro transducer 63 via the optical fiber 62. The optical signal is transduced to an electrical signal at the optical-electro transducer 63, and then input to the display unit controller 55 (see, for example, FIG. 10) as the horizontal and the vertical synchronizing signals.

As the remaining structure of the embodiment in FIG. 12A is the same as the embodiment as shown in FIG. 3, an explanation thereof will be omitted and the same elements are assigned the same reference numerals.

Figure 15:
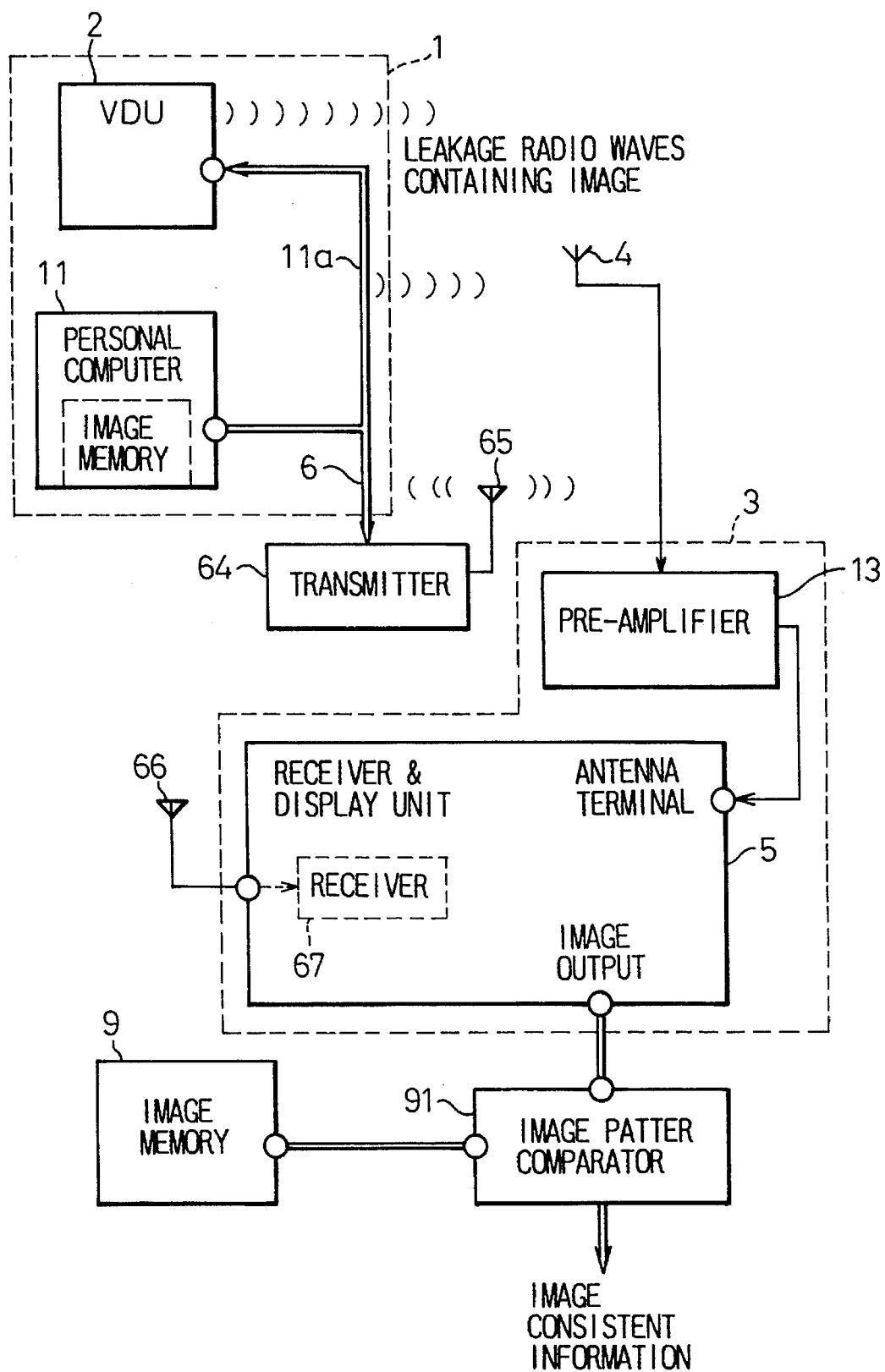
FIG. 15 is a block circuit diagram showing a second modification of the fourth embodiment shown in FIG. 12A.

FIG. 15 is a block circuit diagram showing a second modification of the fourth embodiment shown in FIG. 12A. In this embodiment, the horizontal and vertical synchronizing signals are initially converted to radio waves. Accordingly, a transmitter 64 having a transmitting antenna 65 is provided near the information processing system 1, and a receiver 67 having a receiving antenna 66 is provided in the receiver and visual display unit 5. In this embodiment, the horizontal and vertical synchronizing signals are delivered to the transmitter 64 and then transmitted from the transmitting antenna 65 after the modulation. The radio waves transmitted from the antenna 65 are received by the receiving antenna 66 of the receiver 67. The received signals are demodulated by the receiver 67, and then input to the display unit controller as the horizontal and the vertical synchronizing signals.

The other structure of the embodiment in FIG. 15 is the same as the embodiment as shown in FIG. 12A, so that the explanation of the same elements will be omitted by assigning the same reference numeral.

As the remaining structure of the embodiment in FIG. 15 is the same as the embodiment as shown in FIG. 12A, an explanation thereof will be omitted and the same elements are assigned the same reference numerals.

Figure 16:
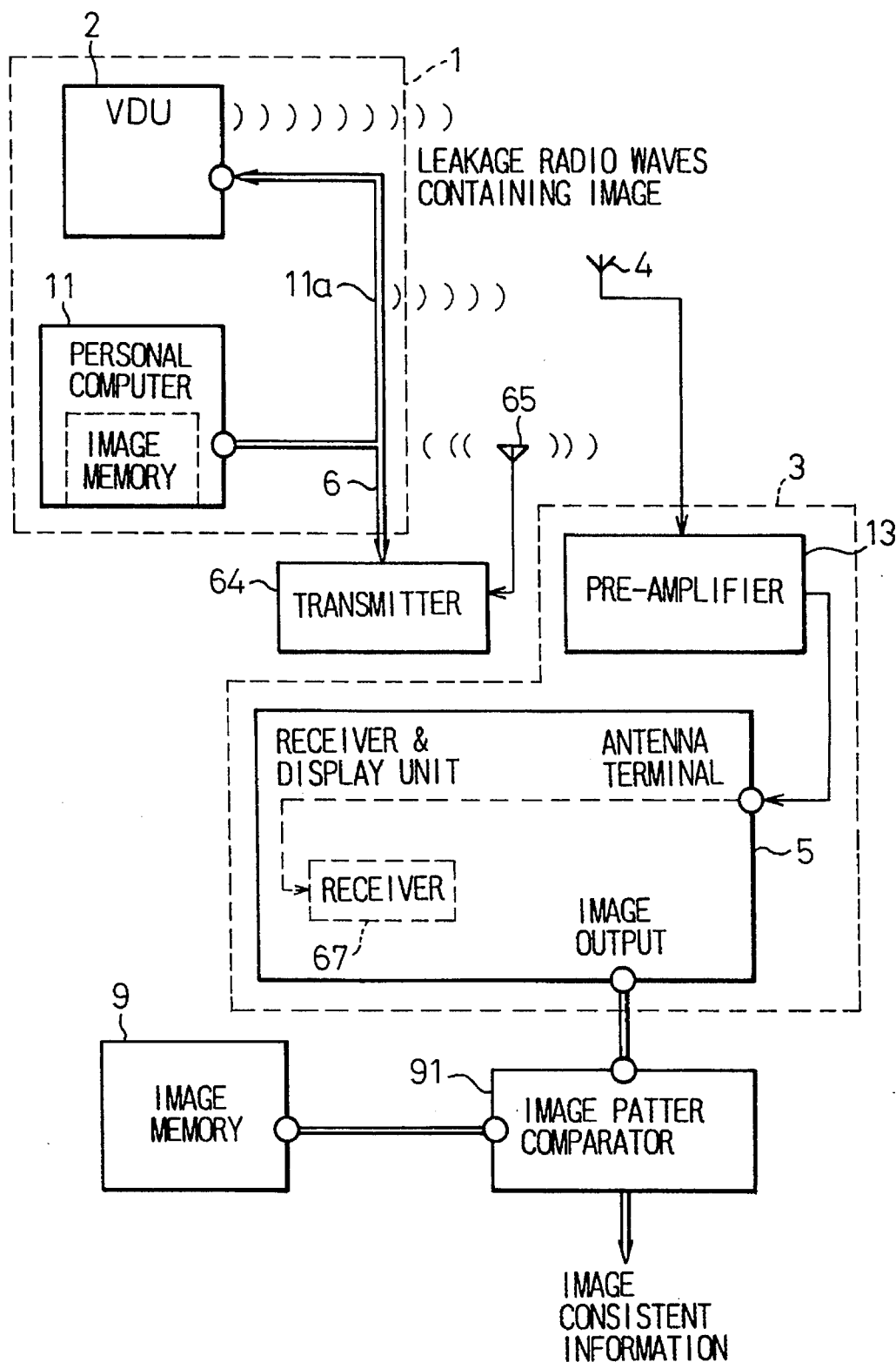
FIG. 16 is a block circuit diagram showing a third modification of the fourth embodiment shown in FIG. 12A.

FIG. 16 is a block circuit diagram showing a third modification of the fourth embodiment shown in FIG. 12A. The structure of the third modification of the fourth embodiment as shown in FIG. 16 is almost the same as the structure of the second modification as shown in FIG. 15. The only difference between the second modification in FIG. 15 and the third modification in FIG. 16 is that the antenna 4 of the testing apparatus 3 is substituted for the antenna of the receiver 67.

As the remaining structure of the embodiment in FIG. 16 is the same as the embodiment as shown in FIG. 15, an explanation thereof will be omitted and the same elements are assigned the same reference numerals.

Although in the afore-mentioned embodiments, the antenna 4 is used to detect an image signal, the present invention is not limited to this working mode. Alternatively, the voltage of a power line may be checked directly to detect an image signal.

What is claimed is:

1. A testing apparatus for detecting an image from an image signal in radio waves leaking from an information processing system, the information processing system using horizontal and vertical synchronizing signals to display the image, the testing apparatus comprising:

radio wave receiving means for receiving the radio waves leaking from the information processing system;

image signal detecting means for detecting the image signal from the received radio waves;

synchronizing signal receiving means for receiving the horizontal and vertical synchronizing signals from the information processing system;

image reproducing means for reproducing the image from the detected image signal by using the received horizontal and vertical synchronizing signals; and display means for displaying the reproduced image.

2. A testing apparatus as set forth in claim 1, wherein the information processing system comprises a processor, a display device and a connecting cable which connects the processor to the display device, and the synchronizing signal receiving means comprises at least one cable which is bifurcated from the connecting cable of the information processing system and receives the horizontal and vertical synchronizing signals from the connecting cable.

3. A testing apparatus as set forth in claim 1, wherein the information processing system comprises a processor, a display device and a connecting cable which connects the processor to the display device, and the synchronizing signal receiving means comprises:

at least one cable which is bifurcated from the connecting cable of the information processing system and receives the horizontal and vertical synchronizing signals from the connecting cable;

an electro-optical transducer which is connected to the at least one cable to receive the horizontal and vertical synchronizing signals from the at least one cable and transduces the horizontal and vertical synchronizing signals into an optical signal;

an optical fiber which receives the optical signal from the electro-optical transducer and conducts the optical signal; and an optical-electro transducer which is connected to the optical fiber to receive the optical signal via the optical fiber and transduces the optical signal into the horizontal and vertical synchronizing signals.

4. A testing apparatus as set forth in claim 1, wherein the information processing system comprises a processor, a display device and a connecting cable which connects the processor to the display device, and the synchronizing signal receiving means comprises:

at least one cable which is bifurcated from the connecting cable of the information processing system and receives the horizontal and vertical synchronizing signals from the connecting cable;

a transmitter which receives the horizontal and vertical synchronizing signals via the at least one cable and modulates a carrier signal by the horizontal and vertical synchronizing signals;

a transmitting antenna which is connected to the transmitter and transmits the modulated carrier signal as radio waves;

a receiving antenna which receives the radio waves transmitted by the transmitting antenna; and a receiver, connected to the receiving antenna, which demodulates the radio waves received by the receiving antenna and reproduces the horizontal and vertical synchronizing signals.

5. A testing apparatus as set forth in claim 4, wherein the radio wave receiving means is also the receiving antenna.

6. A testing apparatus as set forth in claim 1, wherein the display means generates a magnetic field and the synchronizing signal receiving means comprises:

a magnetic sensor which senses the magnetic field generated by the display means and converts the strength of the magnetic field into an electrical signal;

a waveform shaping circuit which shapes the waveform of the electrical signal to reproduce the horizontal synchronizing signal; and a frequency divider which divides the horizontal synchronizing signal reproduced by the waveform shaping circuit to reproduce a vertical synchronizing signal.

7. A testing apparatus as set forth in claim 6, wherein the waveform shaping circuit comprises an amplifier and an analog-to-digital converter.

8. A testing apparatus as set forth in claim 6, wherein the frequency divider comprises a programmable down counter and a digital switch.

9. A testing apparatus as set forth in claim 6, further comprising:

an electro-optical transducer which is connected to the waveform shaping circuit and the frequency divider and transduces the horizontal and vertical synchronizing signals reproduced, respectively, by the waveform shaping circuit and the frequency divider into an optical signal;

an optical fiber which receives the optical signal from the electro-optical transducer and conducts the optical signal; and an optical-electro transducer which is connected to the optical fiber to receive the optical signal via the optical fiber and transduces the optical signal into the horizontal and vertical synchronizing signals.

10. A testing apparatus as set forth in claim 6, further comprising:

a transmitter which is connected to the waveform shaping circuit and the frequency divider and modulates a carrier signal by the horizontal and vertical synchronizing signals reproduced, respectively, by the waveform shaping circuit and the frequency divider;

a transmitting antenna which is connected to the transmitter and transmits the modulated carrier signal as radio waves;

a receiving antenna which receives the radio waves transmitted by the transmitting antenna; and a receiver, connected to the receiving antenna, which demodulates the radio waves received by the receiving antenna and reproduces the horizontal and vertical synchronizing signals.

11. A testing apparatus as set forth in claim 10, wherein the radio wave receiving means is also the receiving antenna.

12. A testing apparatus as set forth in claim 1, further comprising:

image pattern storing means for storing a predetermined image; and an image pattern comparing means, connected to the image reproducing means and the image pattern storing means, for comparing the reproduced image with the predetermined image and for producing a corresponding information signal when the reproduced image is substantially the same as the predetermined image.

13. A testing apparatus as set forth in claim 12, wherein the information processing system comprises a processor, a display device and a connecting cable which connects tile processor to the display device, and the synchronizing signal receiving means comprises at least one cable which is bifurcated from the connecting cable of the information processing system and receives the horizontal and vertical synchronizing signals from the connecting cable.

14. A testing apparatus as set forth in claim 12, wherein the information processing system comprises a processor, a display device and a connecting cable which connects the processor to the display device, and the synchronizing signal receiving means comprises:

at least one cable which is bifurcated from the connecting cable of the information processing system and receives the horizontal and vertical synchronizing signals from the connecting cable;

an electro-optical transducer which transduces the horizontal and vertical synchronizing signals received by the at least one cable into an optical signal;

an optical fiber which receives the optical signal from the electro-optical transducer and conducts the optical signal; and an optical-electro transducer which is connected to the optical fiber to receive the optical signal via the optical fiber and transduces the optical signal into the horizontal and vertical synchronizing signals.

15. A testing apparatus as set forth in claim 12, wherein the information processing system comprises a processor, a display device and a connecting cable which connects the processor to the display device, and the synchronizing signal receiving means comprises:

at least one cable which is bifurcated from the connecting cable of the information processing system and receives the horizontal and vertical synchronizing signals from the connecting cable;

a transmitter which receives the horizontal and vertical synchronizing signals via the at least one cable and modulates a carrier signal by the horizontal and vertical synchronizing signals;

a transmitting antenna which is connected to the transmitter and transmits the modulated carrier signal as radio waves;

a receiving antenna which receives the radio waves transmitted by the transmitting antenna; and a receiver, connected to the receiving antenna, which demodulates the radio waves received by the receiving antenna and reproduces the horizontal and vertical synchronizing signals.

16. A testing apparatus for detecting an image from an image signal in radio waves leaking from an information processing system, the information processing system comprising a processor, a display device and a connecting cable which connects the processor to the display device, the processor being a specific model number and operative to use horizontal synchronizing signal and a vertical synchronizing signal to display the image on the display device, the testing apparatus comprising:

radio wave receiving means for receiving the radio waves;

image signal detecting means for detecting the image signal from the received radio waves;

pseudo-synchronizing signal generating means for generating a pseudo horizontal synchronizing signal and a pseudo vertical synchronizing signal respectively having the same periods as the horizontal synchronizing signal and the vertical synchronizing signal the pseudo-synchronizing signal generating means comprising a processor which is the same model number as the processor of the information processing system;

a phase adjuster which is connected to the pseudo-synchronizing signal generating means and adjusts the phase of the pseudo horizontal synchronizing signal and the pseudo vertical synchronizing signal to agree, respectively, with the phases of the horizontal synchronizing signal and the vertical synchronizing signal;

image reproducing means for receiving the adjusted pseudo horizontal synchronizing signal and the adjusted pseudo vertical synchronizing signal and for reproducing the image from the detected image signal by using the adjusted pseudo horizontal synchronizing signal and the adjusted pseudo vertical synchronizing signal; and display means for receiving the reproduced image and for displaying the reproduced image.

17. A testing apparatus as set forth in claim 16, wherein the processor of the information processing system and the processor of the pseudo-synchronizing signal generating means are both made by the same manufacturer.

18. A testing apparatus for detecting an image from an image signal in radio waves leaking from an information processing system, the information processing system using horizontal and vertical synchronizing signals to display the image, the testing apparatus comprising:

radio wave receiving means for receiving the radio waves;

image signal detecting means for detecting the image signal from the received radio waves;

synchronizing signal receiving means for receiving the horizontal and vertical synchronizing signals from the information processing system;

image reproducing means for reproducing the image from the detected image signal by using the received horizontal and vertical synchronizing signals; and display means for displaying the reproduced image, wherein the information processing system comprises a processor, a display device and a connecting cable which connects the processor to the display device, and the synchronizing signal receiving means comprises at least one cable which is bifurcated from the connecting cable of the information processing system and receives the horizontal and vertical synchronizing signals from the connecting cable.

19. A testing apparatus for detecting an image from an image signal in radio waves leaking from an information processing system, the information processing system using horizontal and vertical synchronizing signals to display the image, the testing apparatus comprising:

radio wave receiving means for receiving the radio waves;

image signal detecting means for detecting the image signal from the received radio waves;

synchronizing signal receiving means for receiving the horizontal and vertical synchronizing signals from the information processing system;

image reproducing means for reproducing the image from the detected image signal by using the received horizontal and vertical synchronizing signals; and display means for displaying the reproduced image, wherein the information processing system comprises a processor, a display device and a connecting cable which connects the processor to the display device, and the synchronizing signal receiving means comprises at least one cable which is bifurcated from the connecting cable of the information processing system and receives the horizontal and vertical synchronizing signals from the connecting cable, an electro-optical transducer which is connected to the at least one cable to receive the horizontal and vertical synchronizing signals from the at least one cable and transduces the horizontal and vertical synchronizing signals into an optical signal, an optical fiber which receives the optical signal from the electro-optical transducer and conducts the optical signal, and an optical-electro transducer which is connected to the optical fiber to receive the optical signal via the optical fiber and transduces the optical signal into the horizontal and vertical synchronizing signals.

20. A testing apparatus for detecting an image from an image signal in radio waves leaking from an information processing system, the information processing system using horizontal and vertical synchronizing signals to display the image, the testing apparatus comprising:

radio wave receiving means for receiving the radio waves;

image signal detecting means for detecting the image signal from the received radio waves;

synchronizing signal receiving means for receiving the horizontal and vertical synchronizing signals from the information processing system;

image reproducing means for reproducing the image from the detected image signal by using the received horizontal and vertical synchronizing signals; and display means for displaying the reproduced image, wherein the information processing system comprises a processor, a display device and a connecting cable which connects the processor to the display device, and the synchronizing signal receiving means comprises at least one cable which is bifurcated from the connecting cable of the information processing system and receives the horizontal and vertical synchronizing signals from the connecting cable, a transmitter which receives the horizontal and vertical synchronizing signals via the at least one cable and modulates a carrier signal by the horizontal and vertical synchronizing signals, a transmitting antenna which is connected to the transmitter and transmits the modulated carrier signal as radio waves, a receiving antenna which receives the radio waves transmitted by the transmitting antenna, and a receiver, connected to the receiving antenna, which demodulates the radio waves received by the receiving antenna and reproduces the horizontal and vertical synchronizing signals.

21. A testing apparatus as set forth in claim 20, wherein the radio wave receiving means is also the receiving antenna.

22. A testing apparatus for detecting an image from an image signal in radio waves leaking from an information processing system, the information processing system using horizontal and vertical synchronizing signals to display the image, the testing apparatus comprising:

radio wave receiving means for receiving the radio waves;

image signal detecting means for detecting the image signal from the received radio waves;

synchronizing signal receiving means for receiving the horizontal and vertical synchronizing signals from the information processing system;

image reproducing means for reproducing the image from the detected image signal by using the received horizontal and vertical synchronizing signals; and display means for displaying the reproduced image, wherein the display means generates a magnetic field and the synchronizing signal receiving means comprises a magnetic sensor which senses the magnetic field generated by the display means and converts the strength of the magnetic field into an electrical signal, a waveform shaping circuit which shapes the waveform of the electrical signal to reproduce the horizontal synchronizing signal, and a frequency divider which divides the horizontal synchronizing signal reproduced by the waveform shaping circuit to reproduce a vertical synchronizing signal.

23. A testing apparatus as set forth in claim 22, wherein the waveform shaping circuit comprises an amplifier and an analog-to-digital converter.

24. A testing apparatus as set forth in claim 22, wherein the frequency divider comprises a programmable down counter and a digital switch.

25. A testing apparatus as set forth in claim 22, further comprising:

an electro-optical transducer which is connected to the waveform shaping circuit and the frequency divider and transduces the horizontal and vertical synchronizing signals reproduced, respectively, by the waveform shaping circuit and the frequency divider into an optical signal;

an optical fiber which receives the optical signal from the electro-optical transducer and conducts the optical signal; and an optical-electro transducer which is connected to the optical fiber to receive the optical signal via the optical fiber and transduces the optical signal into the horizontal and vertical synchronizing signals.

26. A testing apparatus as set forth in claim 22, further comprising:

a transmitter which is connected to the waveform shaping circuit and the frequency divider and modulates a carrier signal by the horizontal and vertical synchronizing signals reproduced, respectively, by the waveform shaping circuit and the frequency divider;

a transmitting antenna which is connected to the transmitter and transmits the modulated carrier signal as radio waves;

a receiving antenna which receives the radio waves transmitted by the transmitting antenna; and a receiver, connected to the receiving antenna, which demodulates the radio waves received by the receiving antenna and reproduces the horizontal and vertical synchronizing signals.

27. A testing apparatus as set forth in claim 26, wherein the radio wave receiving means is also the receiving antenna.

28. A testing apparatus for detecting an image from an image signal in radio waves leaking from an information processing system, the information processing system using horizontal and vertical synchronizing signals to display the image, the testing apparatus comprising:

radio wave receiving means for receiving the radio waves;

image signal detecting means for detecting the image signal from the received radio waves;

synchronizing signal receiving means for receiving the horizontal and vertical synchronizing signals from the information processing system;

image reproducing means for reproducing the image from the detected image signal by using the received horizontal and vertical synchronizing signals;

display means for displaying the reproduced image;

image pattern storing means for storing a predetermined image; and an image pattern comparing means, connected to the image reproducing means and the image pattern storing means, for comparing the reproduced image with the predetermined image and for producing a corresponding information signal when the reproduced image is substantially the same as the predetermined image.

29. A testing apparatus as set forth in claim 28, wherein the information processing system comprises a processor, a display device and a connecting cable which connects the processor to the display device, and the synchronizing signal receiving means comprises at least one cable which is bifurcated from the connecting cable of the information processing system and receives the horizontal and vertical synchronizing signals from the connecting cable.

30. A testing apparatus as set forth in claim 28, wherein the information processing system comprises a processor, a display device and a connecting cable which connects the processor to the display device, and the synchronizing signal receiving means comprises:

at least one cable which is bifurcated from the connecting cable of the information processing system and receives the horizontal and vertical synchronizing signals from the connecting cable;

an electro-optical transducer which transduces the horizontal and vertical synchronizing signals received by the at least one cable into an optical signal;

an optical fiber which receives the optical signal from the electro-optical transducer and conducts the optical signal; and an optical-electro transducer which is connected to the optical fiber to receive the optical signal via the optical fiber and transduces the optical signal into the horizontal and vertical synchronizing signals.

31. A testing apparatus as set forth in claim 28, wherein the information processing system comprises a processor, a display device and a connecting cable which connects the processor to the display device, and the synchronizing signal receiving means comprises:

at least one cable which is bifurcated from the connecting cable of the information processing system and receives the horizontal and vertical synchronizing signals from the connecting cable;

a transmitter which receives the horizontal and vertical synchronizing signals via the at least one cable and modulates a carrier signal by the horizontal and vertical synchronizing signals;

a transmitting antenna which is connected to the transmitter and transmits the modulated carrier signal as radio waves;

a receiving antenna which receives the radio waves transmitted by the transmitting antenna; and a receiver, connected to the receiving antenna, which demodulates the radio waves received by the receiving antenna and reproduces the horizontal and vertical synchronizing signals.

\* \* \* \* \*

UNITED STATES PATENT AND TRADEMARK OFFICE
CERTIFICATE OF CORRECTION

PATENT NO. : 5,465,112
DATED : November 7, 1995
INVENTOR(S) : Tomoyuki NAKAO

It is certified that error appears in the above-indentified patent and that said Letters Patent is hereby corrected as shown below:

Column 5, LINE 46, delete "iS" and insert --is--.

Column 7, line 1, delete "radio-waves" and insert --radio waves--.

Column 8, line 59, before "then" delete "visual" and after "and" insert --visual--.

Column 14, line 5, change "tile" to --the--.

Column 15, line 3, insert --,-- after "signal".

Signed and Sealed this

Twenty-seventh Day of February, 1996

Attest:

BRUCE LEHMAN

Attesting Officer        Commissioner of Patents and Trademarks